United States Patent [19]

Tran

[11] Patent Number: 5,091,879
[45] Date of Patent: Feb. 25, 1992

[54] BICMOS STATIC MEMORY WITH IMPROVED PERFORMANCE STABILITY

[75] Inventor: Hiep V. Tran, Carrollton, Tex.

[73] Assignee: Texas Instruments Incorporated, Dallas, Tex.

[21] Appl. No.: 521,686

[22] Filed: May 9, 1990

Related U.S. Application Data

[63] Continuation of Ser. No. 310,796, Feb. 14, 1989.

[51] Int. Cl.$^5$ .................... G11C 7/00; G11C 11/407
[52] U.S. Cl. ..................... 365/177; 365/207; 365/208; 365/190; 307/530
[58] Field of Search ............... 365/189.01, 204, 177, 365/207, 208, 210, 190, 189.06; 307/530

[56] References Cited

U.S. PATENT DOCUMENTS

| | | | |
|---|---|---|---|
| 4,616,342 | 10/1986 | Miyamoto | 365/190 |
| 4,646,268 | 2/1987 | Kuno | 365/179 |
| 4,658,159 | 4/1987 | Miyamoto | 307/530 |
| 4,665,505 | 5/1987 | Miyakawa et al. | 365/177 |
| 4,910,711 | 3/1990 | Guo | 365/177 X |

FOREIGN PATENT DOCUMENTS 0023792 2/1981 European Pat. Off. .
0184031 11/1985 Japan .
0258715 8/1987 Japan .

OTHER PUBLICATIONS

ISSCC 86 Session XVI; Static Ram's "A13ns/500 mw 64 kg ECL RAM", by Ogive et al., 2/20/86.
ISSCC 88 Session XIII, Static Ram's "A12ns 256 K Bi CMOS SRAM", by Kertis et al., 2/18/88.
IEEE Journal of Solid-State Circuits, vol. 23, No. 5, 10/88, Hiepvantran, et al.
"An 8-ns 256 K ECL SRAM with Memory Array CNOS & Battery Backup".
1988 IEEE International Solid-State Conference, Digest of Technical Papers, 1st. Ed., 2/88 "8-ns BICMOS 256K ECL. SRAM".

*Primary Examiner*—Alyssa H. Bowler
*Attorney, Agent, or Firm*—Stanton C. Braden; William E. Hiller; Richard Donaldson

[57] ABSTRACT

A BiCMOS static random access memory is disclosed, where the sense amplifiers each consist of a pair of bipolar transistors connected in emitter-coupled fashion. A pair of current sources, such as MOS transistors, are connected between the bases of said bipolar transistors and ground, to provide additional pull-down current for the bit lines. This additional pull-down current reduces the differential bit line voltage, improving the speed at which subsequent reads may be performed. Another embodiment uses a dummy column as a detection circuit, with the output of the dummy column controlling an operational amplifier, so that the operational amplifier may bias the current source pair to control the pull-down current, and thus the differential bit line voltage. Another embodiment controls the current source pair responsive to the row address, so that the effects of series bit line resistance may be taken into account in establishing the desired pull-down current.

9 Claims, 9 Drawing Sheets

BICMOS STATIC MEMORY WITH IMPROVED PERFORMANCE STABILITY

This is a continuation of application Ser. No. 07/310,796, filed Feb.14,1989.

This invention is in the field of integrated circuits, and is more specifically directed to circuits for sensing the stored data state in memory devices.

BACKGROUND OF THE INVENTION

Integrated circuit memory devices are often organized into rows and columns of memory cells, with the rows and columns separately selected based on the value of the portions of the memory address which represent row and column addresses. In such devices, the term "word lines" generally refers to a set of conductors of which one, when active, selects the addressed row of memory cells; the term "bit lines" generally refers to a set of conductors which communicate data between memory cells in the addressed row and a sense amplifier. The sense amplifier is a circuit which senses the data state of the data on an associated bit line, and which generally amplifies the sensed data state for communication to output stages of the circuit.

Recently, the use of both bipolar and MOS transistors in a single integrated circuit (such use commonly referred to as BiCMOS technology) has been applied to static random access memories (SRAMs). Such an SRAM is described in my copending applications Ser. No. 018,874, filed Feb. 24, 1987, and Ser. No. 156,520, filed Feb. 16, 1988, both assigned to Texas Instruments Incorporated, and also described in "An 8ns Battery Back-Up Submicron BiCMOS 256k ECL SRAM" by H. V. Tran et al., 1988 *International Solid-State Circuits Conference Digest of Technical Papers* (IEEE, 1988), pp. 188-89, and 364, and in "An 8ns Battery Back-Up Submicron BiCMOS 256k ECL SRAM" by H. V. Tran et al., *IEEE J. Solid State Circuits*, Vol. 23 (IEEE, October 1988), pp. 1041-47, all incorporated herein by this reference. The memory described in said application Ser. No. 156,520 provides a single sense amplifier for each column in the memory cell array. The provision of such a single sense amplifier improves the sensing resolution, as the length of the bit lines associated therewith is reduced from that if a single sense amplifier were associated with multiple columns in the memory.

In said application Ser. No. 156,520, the sense amplifier is formed of a pair of emitter-coupled bipolar transistors, with their bases connected to the complementary bit lines of the column. A current source, such as an MOS transistor, is connected to the emitters of the pair, so that the differential current received by the bases of the transistors creates a differential collector current through the pair, creating a differential voltage at the collectors which is communicated to a second stage sense amplifier. Each of the bit lines in the selected column are actively pulled down; the lower potential bit line is pulled down through the memory cell, and the higher potential bit line is pulled down by the current into the base of the sense amplifier transistor.

As the size of the memory device using such a sense amplifier increase, the length and parasitic capacitance of the bit lines also increases. If the capacitance of the bit lines is sufficiently great, the current pulled down into the base of the sense amplifier transistor may not be sufficiently large to fully pull down the bit line at the higher potential, so that the bit line effectively floats. If the bit line which is at the high logic state is effectively floating-power supply noise which couples onto the bit line can raise the potential of the bit line, widening the differential voltage, and slowing the response of the memory if the next cycle reads another memory cell in the same column of the opposite data state.

It is therefore an object of this invention to provide an improved sense amplifier by providing active pull-down devices for the bit lines.

It is a further object of this invention to provide such pull-down devices which are selectively enabled by the column address signal.

Variations in the differential bit line voltage of such a memory are also not desired. Such variations can result from variations in the manufacturing process of the device, resulting in variations in electrical parameters such as the threshold voltage, effective channel length and k' parameters of the MOS transistors. If the differential bit line voltage is sensitive to these transistor parameters, it is likely that the manufacturing yield of the memory device will be degraded due to performance sensitivity of the device to changes in the manufacturing parameters. Such variations in the differential bit line voltage can also be due to variations in the operating parameters of the device, such as power supply voltage and temperature; if performance is sensitive to variations in these parameters, the specified operating range of the device may be limited.

It is therefore a further object of this invention to provide such a memory having performance which has a reduced sensitivity to manufacturing and operating parameters.

Furthermore, for long bit line architectures, the resistance of the bit line between the pull-up resistors and the selected cell can significantly affect the bit line differential voltage. It is preferable to adjust the bit line differential voltage in such a way as to take into consideration the series bit line resistance, as well as to keep the bit line differential voltage constant regardless of the position of the selected cell in the column, so that address-dependent performance variations are not present.

It is therefore a further object of this invention to provide such a sense amplifier which further has series current source transistors controlled by a gain control circuit, so that the bit line differential voltage is maintained relatively constant regardless of the position of the selected cell in the column.

Other objects of the invention will be apparent to those of ordinary skill in the art having reference to the following specification, in conjunction with the drawings.

SUMMARY OF THE INVENTION

The invention may be incorporated into a BiCMOS SRAM read/write memory having a pair of complementary bit lines associated with each column of memory cells, and a sense amplifier associated with each column. The sense amplifiers include emitter-coupled bipolar transistors which have their bases connected to the bit lines of the column, and which have their emitters coupled to a current source. Pull-down devices, controlled by the column select signal, are connected between the bit lines and the reference supply, so that a pull-down current is maintained, preventing floating of either of the bit lines, maintaining the differential voltage. In a further embodiment, a gain control circuit is provide which measures the differential voltage for a dummy column and which adjusts the current flow through the pull-down devices to maintain a relatively constant differential voltage.

DETAILED DESCRIPTION OF THE PREFERRED EMBODIMENT

Figure 1:
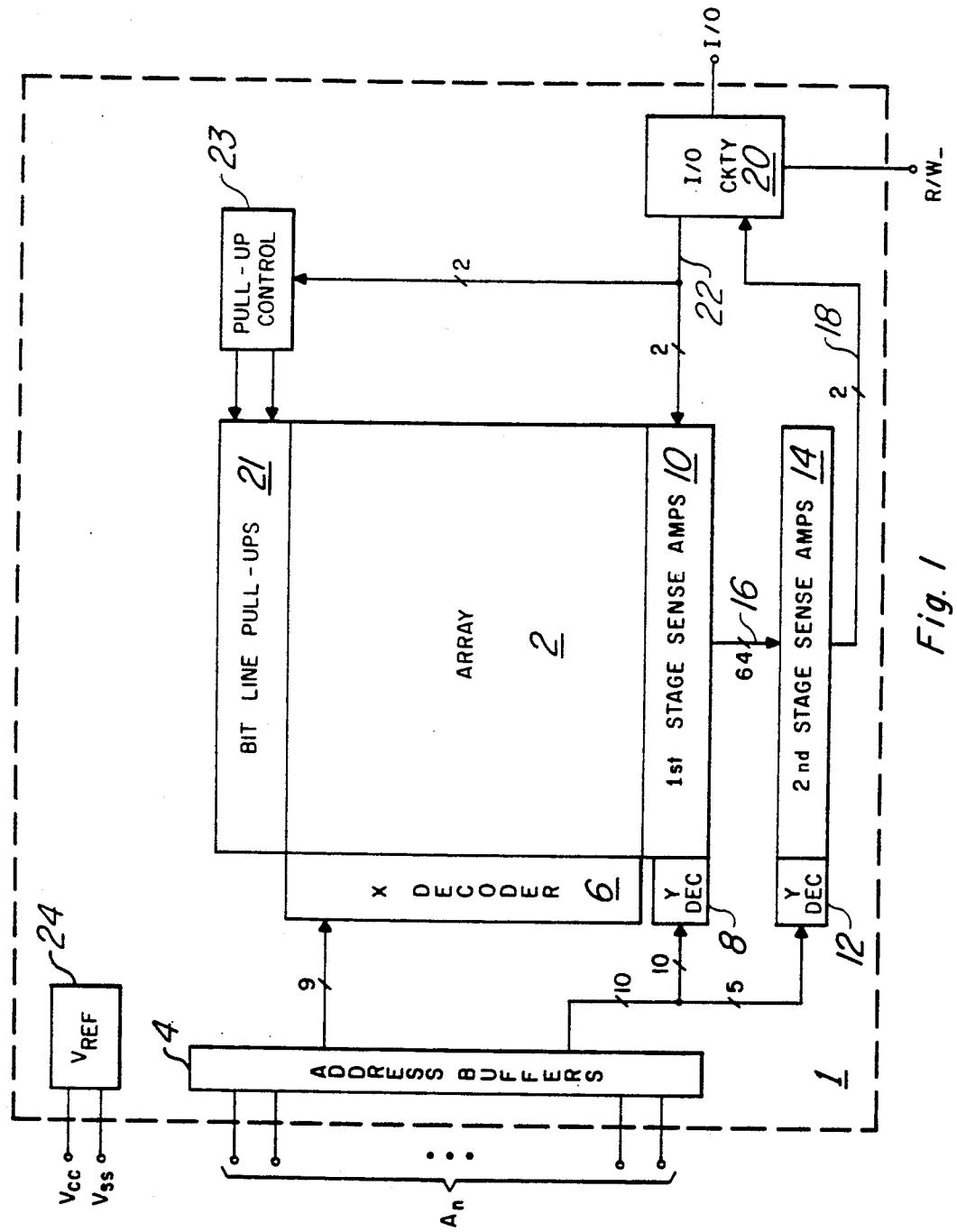
FIG. 1 is an electrical diagram, in block form, of a static random access memory (SRAM) incorporating the invention.

Referring now to FIG. 1, a block diagram of a static random access memory (SRAM) 1 is illustrated. This embodiment of SRAM 1 is a 1M bit memory, having a single input/output terminal I/O (i.e., SRAM 1 is organized as a 1M by 1 memory). The storage elements of SRAM 1 are contained in array 2, which in this embodiment is organized into 512 rows by 2048 columns. SRAM 1 receives address information on address inputs $A_n$. To individually address each bit within the 1M bit memory, address inputs $A_n$ number nineteen. Of course, if more than one bit were to be accessed at a time (for example, if 1M bit SRAM 1 were organized as a 128k by 8 memory, having eight inputs and eight outputs), fewer address inputs $A_n$ would be required.

Address inputs $A_n$ are received by address buffers 4 which, as is well known in the art, buffer the value of the address externally presented at address inputs $A_n$. Nine of the nineteen address bits received by address buffers 4, such nine bits corresponding to a row address, are communicated to X decoder 6, for selecting one of the 512 rows in array 2. The remaining ten bits received by address buffers 4, corresponding to a column address, are communicated to first stage Y decoder 8, for selection of one of the 2048 columns in array 2 to be sensed by one of the 2048 first stage sense amplifiers 10. Each of the 2048 columns, and accordingly each of the 2048 first stage sense amplifiers, are associated with a complementary pair of bit lines, as will be described hereinbelow, and the selected one of the 2048 first stage sense amplifiers senses the differential voltage of the complementary bit lines. A bank of bit line pull-up transistors 21 are provided in SRAM 1, as will be explained in further detail below.

Five of the ten column address bits are also communicated to second stage Y decoder 12, for selection of one of the second stage sense amplifiers 14. While FIG. 1 illustrates two separate Y decoders 8 and 12, second stage Y decoder 12 may alternatively be incorporated into first stage Y decoder 8. Such incorporation would use the output of the second stage sense amplifier 14 not only to select the appropriate second stage sense amplifier 14 but also in the decoding of the column address signal to select one of the first stage sense amplifiers 10, if multiple decoding stages are desired within first stage Y decoder 8 and if the break between decode stages therewithin is made at the point necessary to select one of the second stage sense amplifiers 14. The 2048 first stage sense amplifiers 10 are grouped into thirty-two groups of thirty-two, with each group having a complementary pair of local data lines 16 as an output. One of second stage sense amplifiers 14 is associated with each group of thirty-two first stage sense amplifiers, and receives at its input the associated pair of local data lines 16. A complementary pair of data-out lines 18 are driven by second stage sense amplifiers 14. In operation, the first stage sense amplifier 10 which corresponds to the column address is enabled by a signal from first stage Y decoder 8, while Y decoder 8 disables the others of first stage sense amplifiers 10 from sensing the data state of its associated pair of bit lines from array 2. The one of second stage sense amplifiers 14 which corresponds to the group of first stage sense amplifiers 10 having the selected column is also enabled, and the others of second stage sense amplifiers 14 are disabled. The selected one of second stage sense amplifiers 14 presents, on data-out lines 18, a differential voltage which is the amplification of the differential voltage on the local data lines 16 at its input, for communication to input/output circuitry 20. Input/output circuitry 20 communicates the state of data-out lines 18 to input-/output terminal I/O.

Input/output circuitry 20 of SRAM 1 of FIG. 1 also receives input data from input/output terminal I/O; the determination of whether a read or a write cycle is desired depends upon the state of terminal $R/W_{13}$, connected to input/output circuitry 20. During a write cycle, input/output circuitry 20 presents the logic state externally presented at input/output terminal I/O onto data-in bus 22, which presents the true and complement states of the input data to first stage sense amplifiers 10 for communication to the selected memory cell in array 2. Data-in bus 22 is also connected to pull-up control circuitry 23, to effect the write recovery operation described in further detail hereinbelow.

SRAM 1 also has reference voltage circuit 24, which receives the power supply voltages $V_{cc}$ and $V_{ee}$ (ground potential). Power supply voltages $V_{cc}$ and $V_{ee}$ are routed to transistors throughout SRAM 1 for biasing purposes, such routing not shown in FIG. 1 for purposes of clarity. The particular embodiment of SRAM 1 described herein is a BiCMOS SRAM, utilizing both bipolar transistors, as well as p-channel and n-channel MOS transistors. Certain circuits in this embodiment of SRAM 1 are realized in in emitter-coupled logic. Where emitter-coupled logic is used reference voltage circuit 24 provides a band-gap reference voltage.

Figure 2:
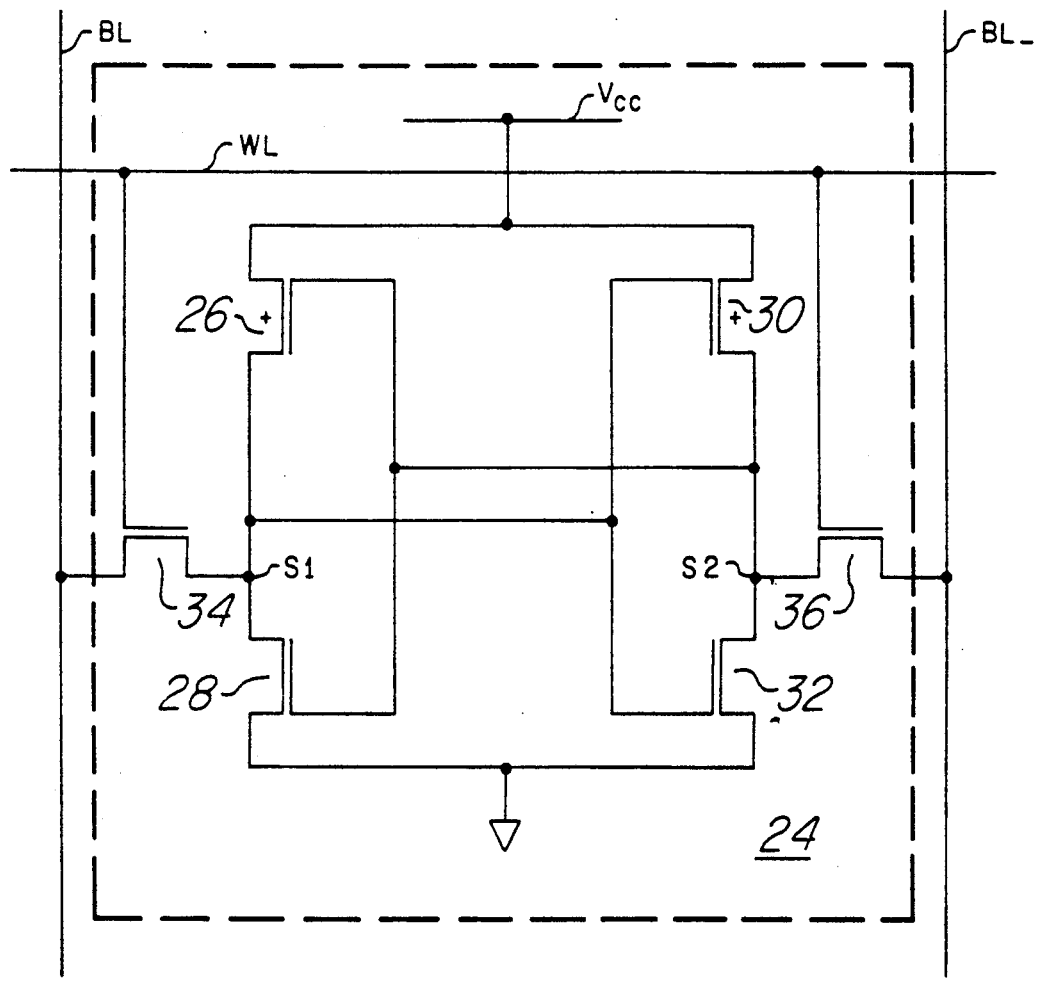
FIG. 2 is an electrical diagram, in schematic form, of a conventional CMOS memory cell as can be used in the SRAM of FIG. 1.

Referring now to FIG. 2, a conventional CMOS static memory cell 24 as incorporated in BiCMOS SRAM 1 is illustrated. Memory cell 24 is constructed according to the well-known cross-coupled inverter realization; since both p-channel and n-channel transistors are available, CMOS inverters are used in memory cell 24. A first CMOS inverter in memory cell 24 is made up of p-channel transistor 26 and n-channel transistor 28 having their source-to-drain paths connected in series between $V_{cc}$ and ground, and having their gates tied together. The second CMOS inverter in memory cell 24 is similarly constructed, with p-channel transistor 30 and n-channel transistor 32 having their source-to-drain paths connected in series between $V_{cc}$ and ground, and their gates also common. The cross-coupling is accomplished by the gates of transistors 26 and 28 being connected to the drains of transistors 39 and 32 (node S1 of FIG. 2), and by the gates of transistors 30 and 32 being connected to the drains of transistors 26 and 28 (node S2 of FIG. 2). N-channel pass transistor 34 has its source-to-drain path connected between node S1 and a first bit line BL, and has its gate connected to word line WL. N-channel pass transistor 36 similarly has its source-to-drain path connected between node S2 and a second bit line BL__, and has its gate also connected to word line WL.

In operation, the voltages of node S1 and S2 will necessarily be logical complements of one another, due to the cross-coupled nature of the CMOS inverters within memory cell 24. The higher of the two nodes S1 and S2 will be pulled high by one of associated p-channel transistors 26 and 30, respectively, and the lower of the two nodes S1 and S2 will be pulled low by one of associated n-channel transistors 28 and 32, respectively. For purposes of the following description, the current pulling down the lower of the two nodes S1 and S2 through n-channel transistors 28 and 32, respectively, will be referred to as $i_{cell}$. When word line WL is energized by X decoder 6 shown in FIG. 1, according to the row address received at address inputs $A_n$, pass transistors 34 and 36 will be turned on, coupling nodes S1 and S2 to bit lines BL and BL__, respectively. Accordingly, the state of bit lines BL and BL__ will be logical complements of one another when a memory cell 24 is connected thereto by the energizing of word line WL.

As described above for this embodiment, there are 512 word lines WL and 2048 pairs of bit lines BL and BL__ in array 2 of FIG. 1 For each value of the row address decoded by X decoder 6, one word line WL will be energized, connecting 2048 memory cells 24 to the 2048 pairs of bit lines BL and BL__. Since the other 511 word lines WL will be at a low logic level, only the one memory cell 24 associated with the selected word line WL in each column will be connected to the pair of bit lines BL and BL__ at a time.

Figure 3:
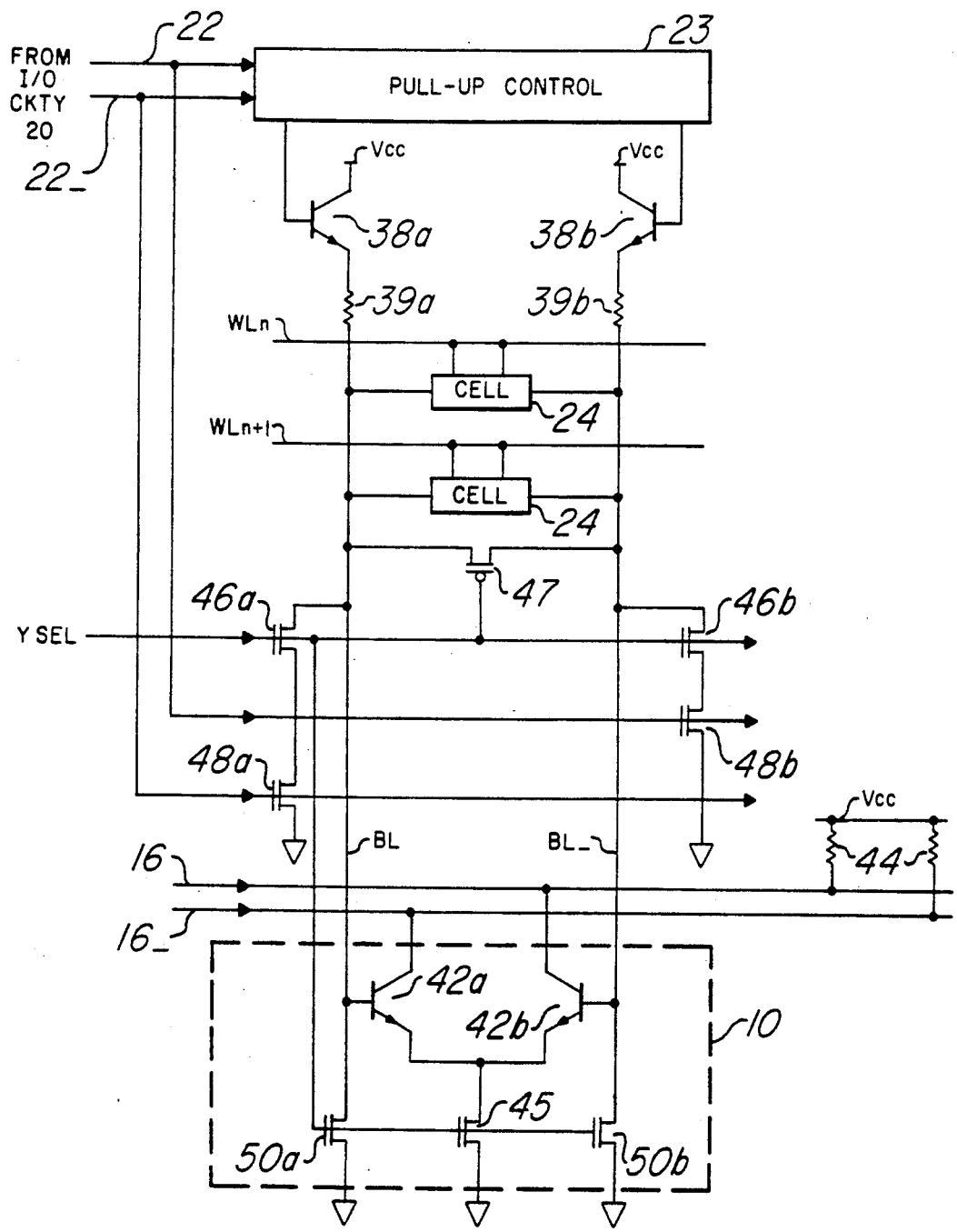
FIG. 3 is an electrical diagram, in schematic form, of a bit line pair in conjunction with the bit line pull-up circuitry and first stage sense amplifier.

Referring now to FIG. 3, a column of array 2 is illustrated. Only two memory cells 24 are illustrated, in conjunction with only two word lines $WL_n$ and $WL_{n+1}$, for purposes of clarity; as described above, each column has 512 memory cells 24 associated with 512 independent word lines WL. In the column shown in FIG. 3, cells 24 are shown connected to complementary bit lines BL and BL__. Bit lines BL and BL__ are connected to first stage sense amplifier 10 and, via n-p-n pull-up transistors 38a and 38b, respectively, to $V_{cc}$. Pull-up transistors 38 correspond to bit line pull-ups 21 shown in FIG. 1. The bases of pull-up transistors 38a and 38b are driven by pull-up control circuitry 23, which receives clocked input data from input/output circuitry 20 on data-in bus 22.

The write circuitry for a particular column consists of n-channel transistors 48a and 48b, which have their source-to-drain paths connected in a path between bit lines BL and BL__, respectively, and ground. The gates of n-channel transistors 48a and 48b are controlled by data-in lines 22__ and 22, respectively, one of which is taken to a high logic level at the time that a write operation is to occur, with the choice between data-in line 22 and 22__ depending upon the input data received at input/output terminal I/O. During read cycles, both data-in lines 22 and 22__ remain at a low logic level. N-channel transistors 46a and 46b are connected in series between transistors 48a and 48b, on the one hand, and bit lines BL and BL__, respectively, on the other hand. The gates of both of transistors 46a and 46b are controlled by line YSEL, so that the state of data-in lines 22 and 22__ affects only the selected one of the 2048 columns, and is isolated from the other columns.

First stage sense amplifier 10 consists of two emitter-coupled n-p-n transistors 42a and 42b, which have their bases connected to bit lines BL and BL__, respectively. The emitters of transistors 42a and 42b are connected to the drain n-channel transistor 45, which has its source coupled to ground and its gate connected to line YSEL. Transistor 45 is turned off when the column is not selected (i.e., line YSEL low), and is turned on to act as a current source when the column is selected (i.e., line YSEL high). Line YSEL also is connected to p-channel transistor 47, which serves to equalize bit lines BL and BL__ when transistor 47 is on due to line YSEL low. Line YSEL, for a particular column, is low during cycles in which the column is not selected, equalizing bit lines BL and BL__. The collectors of transistors 42a and 42b are connected to local data lines 16__ and 16, respectively. As described above for this embodiment, thirty-two first stage sense amplifiers 10 share local data lines 16 and 16__. Local data lines 16 and 16a__ are pulled up to $V_{cc}$ by resistors 44, so that the higher of the two bit lines BL and BL__, sourcing the higher base current to its bipolar transistor 42 to cause the higher collector current therethrough, will pull down the local data line 16__ or 16, with the other local data line remaining at a high voltage due to the pull-up resistor 44.

According to the instant invention, first stage sense amplifier 10 further has n-channel MOS transistors 50a and 50b. Transistors 50a and 50b have their drains connected to the bit lines BL and BL__, respectively, at the bases of transistors 41a and 42b, respectively, and their sources at ground. It should be noted that it is preferred from a layout standpoint that the sources of transistors 50a and 50b be connected to the same reference supply, in this case ground (or $V_{ee}$) as transistor 45; of course, the sources of transistors 50a and 50b may be connected to a reference voltage other than that to which the source of transistor 45 is connected, if desired. The gates of transistors 50a and 50b are controlled by the state of the column select line YSEL. Transistors 50a and 50b are for providing additional pull-down current for the selected column to ensure that the higher potential bit line does not float undesirably high due to power supply or other noise coupling thereto, as will be described hereinbelow. For non-selected columns, line YSEL is in a low logic state, so that transistors 50a and 50b are off and do not draw static current.

Figure 4:
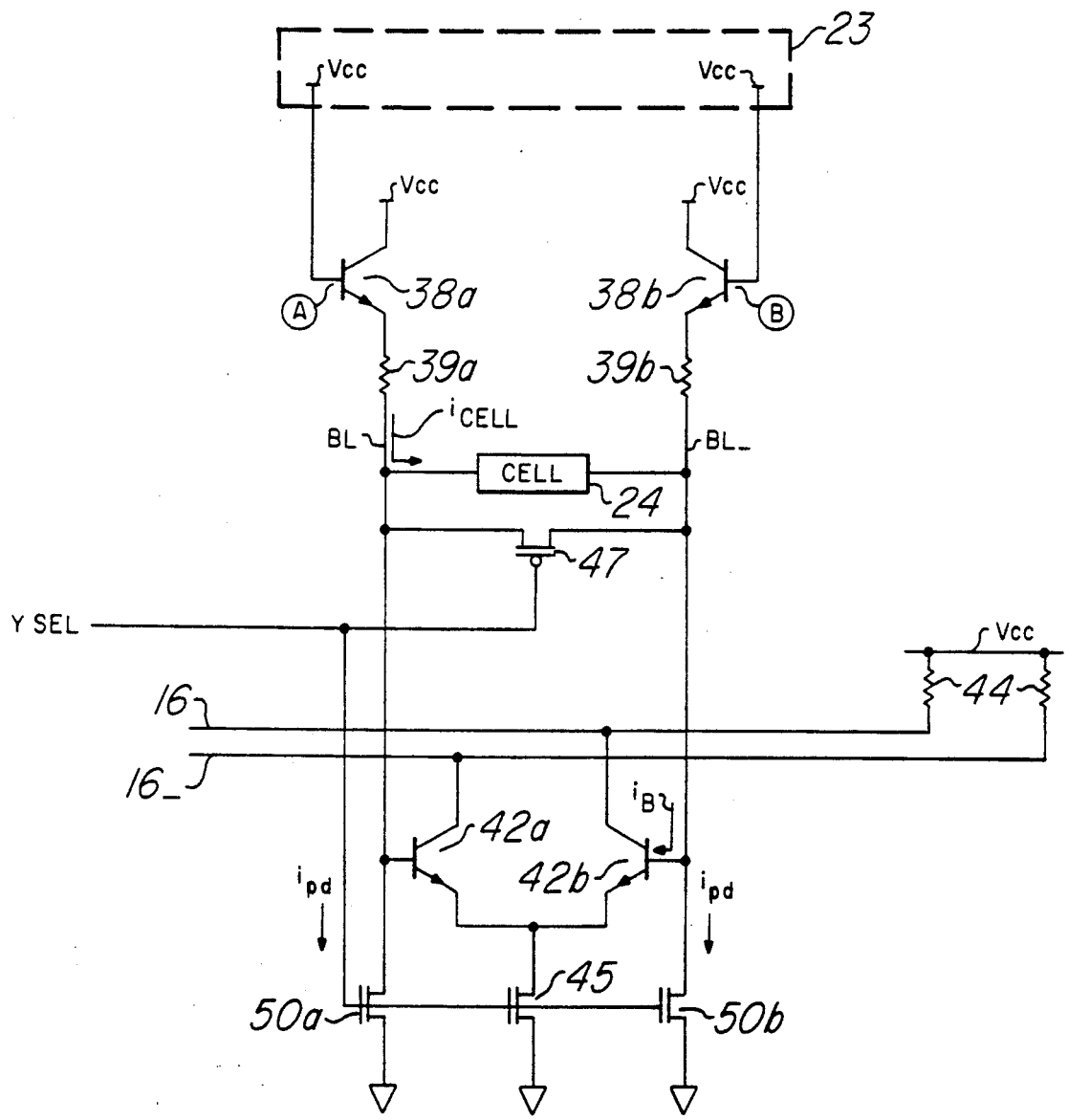
FIG. 4 is an electrical diagram, in schematic form, illustrating the operation of the sense amplifier of the invention during a read cycle.

Referring now to FIG. 4, an equivalent schematic for a selected column in array 2 will be shown, illustrating the benefit of transistors 50a and 50b during a read operation. As described in said application Ser. No. 156,520, the base of each of pull-up transistors 38a and 38b is biased to $V_{cc}$ for a read operation. The voltages at the emitters of pull-up transistors 38a and 38b is thus at $V_{cc}-V_{be}$. For purposes of the following description, it will be assumed that the state of cell 24 which is selected is such that a high state will be communicated to bit line BL__ and a low state to bit line BL (i.e., a zero state stored by cell 24). The circuit will, of course, operate symmetrically for the opposite data state. Referring also to FIG. 2, for this data state bit line BL will be pulled low by n-channel transistor 28, with a current to be referred to herein as $i_{cell}$. The higher potential bit line BL_ will be pulled low by the base current into bipolar transistor 42b in sense amplifier 10, with a current to be referred to as $i_B$.

The differential voltage between bit lines BL and BL_ in the read operation can thus be found by the following relationship:

$$dV_{BL} = (i_{cell} - i_B)R_{38} + V_{th} ln[(i_{cell} + i_{PD})/(i_B i_{PD})] \quad (1)$$

where $dV_{BL}$ is the differential bit line voltage, $R_{39}$ is the resistance value of resistors 38a and 38b. $V_{th}$ is the thermal voltage kT/q (approximately 25 mV at room temperature), and $i_{PD}$ is the current through each of transistors 50a and 50b.

The first term of equation (1) is the differential in the voltage drop through resistors 39a and 38b due to the difference in current therethrough; it should of course be noted that $i_{PD}$ also conducts through resistors 38a and 38b, but for purposes of calculating the differential current the voltage drop due to $i_{PD}$ is the same for both resistors 38a and 39b. The value of the first term of equation (1) is thus dependent upon the current capability (i.e., the k' value) of the one of n-channel transistors 28 and 32 which is conducting in the selected memory cell 24.

The second term of equation (1) is the difference in the base-emitter voltages $V_{be}$ of pull-up transistors 38a and 38b, due to the difference in current sourced thereby. In the configuration described in said application Ser. No. 156,520, $i_{PD}$ is zero, since no pull-down transistors 50a and 50b are present. For such a configuration, the current capability of the n-channel transistors in the memory cells 24 and also the base current $i_B$, thus determine the differential $V_{be}$.

This configuration is sufficient insofar as the bipolar transistors 42 can draw sufficient base current to keep the higher potential bit line (bit line BL_ in this example) from floating. However, as the size of the memory increases, for example as more memory cells are associated with each of the columns, the parasitic capacitance of the metal or other bit line conductors also increases. The increased capacitance presents an increased load to the bipolar transistors 42a and 42b, such an increased load reducing the ability of the transistors 42 to hold down the higher potential bit line, and increasing the likelihood that the bit line can effective float. As described hereinabove, if the higher potential bit line BL_ effectively float, power supply or other noise can couple thereto and increase the bit line differential voltage. If the next subsequent cycle has the opposite data state from the prior cycle, any differential voltage in the bit lines of the selected column must be discharged prior to the memory cell again establishing the differential current of the correct memory state. The time required for the memory cell, and the bipolar transistor 42, to discharge the prior differential voltage thus becomes a factor in the memory access time. While equalization transistor 47 is provided to equalize bit lines BL and BL_, this transistor 47 only will be turned on when the column is in an unselected state. For high performance SRAMs, if the same column is selected in successive cycles, either transistor 47 will never turn on, or it will only be on for a very short time between cycles which, for a large bit line differential voltage, may be insufficient to discharge the differential from the prior cycle.

In the embodiment of FIGS. 3 and 4, however, pull-down transistors 50a and 50b are provided in order to provide additional pull-down current to that of the bipolar transistor 42 (in this case 42b) which is associated with the higher potential bit line in the selected column. This additional pull-down current will reduce the noise sensitivity of the memory.

Furthermore, referring to the second term of equation (1), as $i_{PD}$ increases, the value of this second term (1) will decrease, resulting in a reduction in the value of $dV_{BL}$. Since sense amplifier 10 senses current rather than differential voltage, so long as a detectable current difference remains, a small bit line differential voltage is not undesirable. Indeed, a small bit line differential voltage is preferred, considering the case of a consecutive read cycles (or a read after a write), where the data state of the selected column changes from cycle to cycle. Pull-down transistors 50a and 50b thus provide the benefit of reduction of the bit line differential voltage, allowing fast access time in the subsequent read cycles.

Figure 5:
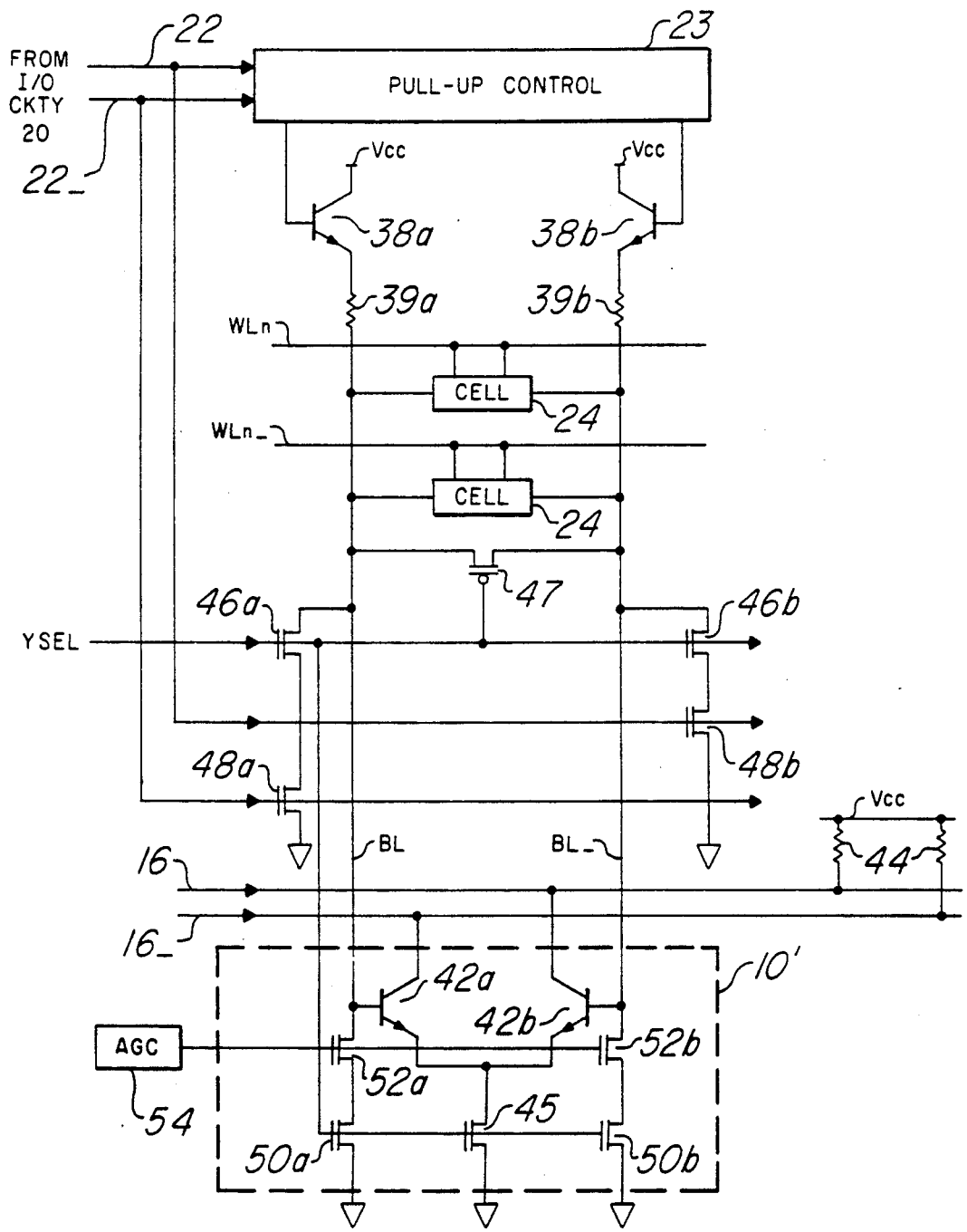
FIG. 5 is an electrical diagram, in schematic form, illustrating a second embodiment of the invention including a gain control circuit for the pull-down current.

The embodiment of the invention described hereinabove relative to FIGS. 3 and 4 provides the benefits of improved noise immunity as well as improved performance from the reduced bit line differential voltage. Referring now to FIG. 5, a second preferred embodiment of the invention is illustrated which can provide additional stability to the operation of the memory by its control of the current $i_{PD}$. As described above relative to equation (1), the operating characteristics of the n-channel pull-down transistors 28 and 32 in the memory cell 24 determine the current $i_{cell}$ which pulls down the one of bit lines BL and BL_ having the lower logic level. Accordingly, the first term in equation (1) which determines the differential bit line voltage $dV_{BL}$, and accordingly the value of $dV_{BL}$ itself, is strongly dependent upon the operating characteristics of the n-channel MOS transistors 28 and 32. The embodiment of FIG. 5 is directed to the adjustment of the current $i_{PD}$ to compensate for variations in the the differential bit line voltage $dV_{BL}$ a temperature and voltage range, as well as over a range of MOS transistor parameters such as threshold voltage, effective channel length, and k'.

Sense amplifier 10' in the embodiment of FIG. 5 includes additional n-channel transistors 52a and 52b which are connected in series with transistors 50a and 50b, respectively, between bit lines BL and BL_ and ground. The gates of transistors 52a 52b are controlled by automatic gain control circuit 54. The purpose of transistors 52a and 52b is to control the current $i_{PD}$ passing therethrough. The differential bit line voltage $dV_{BL}$ can be maintained relatively constant as resistance $R_{BL}$ increase if the second term, which exponentially depends on the current ratio of bit lines BL and BL_, is adjusted accordingly. Automatic gain control circuit 54 is intended to accomplish this by reducing the gate voltage of transistors 52 (and thus the source/drain current therethrough) responsive to an increase in $R_{BL}$, and by increasing the gate voltage of transistors 52 responsive to a decrease in $R_{BL}$.

Figure 6:
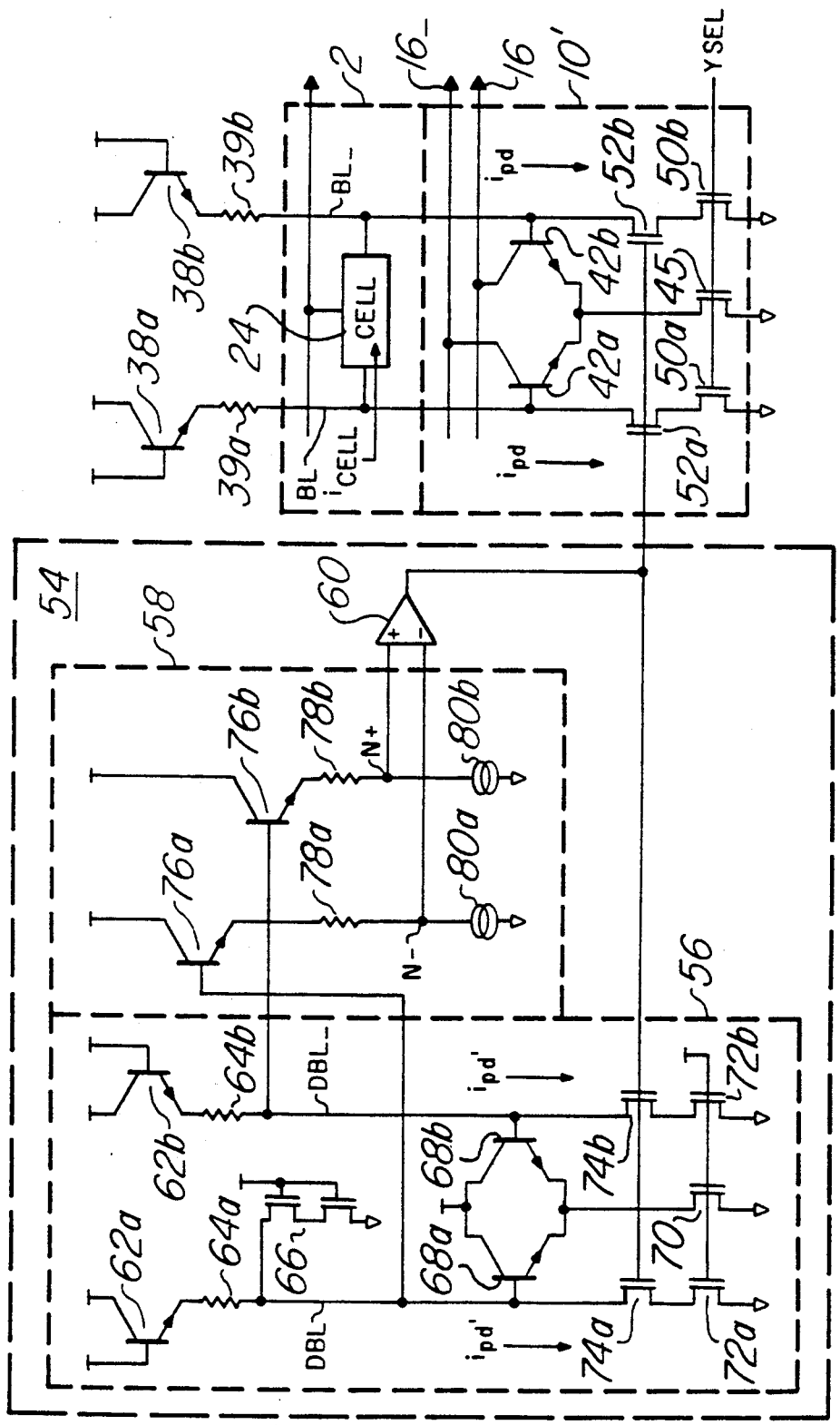
FIG. 6 is an electrical diagram, in schematic form, of the gain control circuit of FIG. 5.

Referring to FIG. 6, an embodiment of automatic gain control circuit 54, and its interaction with a selected column in array 2, is illustrated. Automatic gain control circuit 54 consists of bit line differential voltage detection circuit 56, having outputs to level shifter 58, which has outputs to an operational amplifier 60. The output of op amp 60 is connected to the gates of transistors 52a and 52b, and is also connected in feedback fashion to bit line differential voltage detection circuit 56.

Bit line differential voltage detection circuit 56 contains, in effect, a dummy column which simulates the operation of a column in array 2, for purposes of determining the proper drive for transistors 52a and 52b. This dummy column includes pull-up transistors 62a and 62b, each with their collectors and bases connected to $V_{cc}$, providing a bias similar to that for pull-up transistors 38a and 38b in array 2. Resistors 64a and 64b are connected to the emitters of transistors 62a and 62b, and have a value similar to that of resistors 39a and 38b in array 2. N-channel MOS transistors 66, connected in series between bit line DBL and ground, and having their gates tied to $V_{cc}$, are designed to emulate $i_{cell}$ being drawn by the n-channel MOS transistor in the selected memory cell 24. Bit line differential voltage detection circuit 56 further includes a sense amplifier similar sense amplifier 10', including bipolar transistors 68a and 68b connected in emitter-coupled fashion, having their collectors connected to $V_{cc}$, their bases connected to dummy bit lines DBL and DBL—, respectively, and their emitters connected in common to the drain of n-channel MOS transistor 70, which has its source connected to ground, to serve as a current source for emitter-coupled transistors 68. The gate of transistor 70 is biased to $V_{cc}$, emulating the selected column in array 2. The bases of transistors 68a and 68b, at dummy bit lines DBL and DBL—, are each connected to a cascode pull-down current source, similarly as those in array 2. The cascode current sources consist of transistors 74a and 76a connected in series between dummy bit line DBL and ground, and transistors 74b and 76b connected in series between dummy bit line DBL— and ground. The gates of transistors 76 are biased to $V_{cc}$, to emulate the selected column in array 2. The gates of transistors 74 and biased by the output of automatic gain control circuit 54 from op amp 60, which also biases the gates of transistors 52a and 52b in array 2.

Dummy bit lines DBL and DBL— are also connected to level shifter circuit 58. The purpose of level shifter circuit 58 is to shift the signals on dummy bit lines DBL and DBL— to the optimum input operating levels of op amp 60, as well as to provide stability in the input to op amp 60 over the operating range of the memory. Level shifter 58 includes bipolar transistors 76a and 76b which have their bases connected to bit lines DBL— and DBL, respectively, and the collectors biased to $V_{cc}$. The emitters of transistors 76a and 76b are connected through resistors 78a and 78b, respectively, to current sources 80a and 80b. Resistors 78a and 78b preferably have the same value $R_{78}$, and are used to define an offset voltage $V_{os}$, equal to the product of $R_{78}$ and the difference in the currents provided by current sources 80a and 80b. This offset voltage is selected at the voltage desired for the dummy bit line differential voltage $dV_{DBL}$. Current sources 80a and 80 provide stable reference currents therethrough, and are preferably generated from a band gap reference circuit to obtain temperature and voltage stability for $V_{os}$. An example of a BiCMOS band gap reference circuit is described in my copending patent application Ser. No. 161,694 filed Feb. 16, 1988, assigned to Texas Instruments Incorporated and incorporated herein by this reference.

Op amp 60 receives the voltage at node N+ between resistor 78b and current source 80b at its non-inverting input, and receives the voltage at node N- between resistor 78a and current source 80a at its inverting input. Due to the constant current sourced by current sources 80a and 80b, the voltage drop across resistors 78a and 78b will remain relatively constant, so long as the base-emitter junctions of transistors 76a and 76b are forward biased so that transistors 76 are on. Accordingly, the voltage at node N+ will substantially follow variations in the voltage at the base of transistor 76b (on dummy bit line DBL—), and the voltage at node N— will substantially follow variations in the voltage at the base of transistor 76a (on dummy bit line DBL). Op amp 60 may be any type of operational amplifier which may be incorporated into the integrated circuit with the memory; since both bipolar and MOS transistors are utilized in the BiCMOS memory described herein, op amp 60 may of course of the BiCMOS type as well, if desired. The output of op amp 60 is connected to the gates of transistors52 in array 2, as well as to the gates of transistors 74 in bit line differential voltage detection circuit 56.

In operation, bit line differential voltage detection circuit 56, due to the provision of transistors 66 connected to dummy bit line DBL only, establishes a differential current between dummy bit lines DBL and DBL—, via the operation of emitter-coupled bipolar transistors 68a and 68b and current source 70. As in the case of a selected column in array 2, this will translate into a dummy bit line differential voltage $dV_{DBL}$ (dummy bit line DBL— being at a high state relative to dummy bit line DBL), according to equation (1) hereinabove. This dummy bit line differential voltage $dV_{DBL}$ is communicated, via level shifter circuit 58, to the inputs of op amp 60. In the case where the voltage $dV_{DBL}$ exceeds the desired offset voltage $V_{os}$ in level shifter circuit 58, the voltage at node N+ will be higher than the voltage at node N—, since node N+ will substantially follow variations in the base voltage of transistor 76b. Such a higher dummy bit line differential voltage can be caused by variations in the value of power supply $V_{cc}$ or in the temperature of the memory which cause a variation in the operating characteristics of transistors 66. This situation will cause op amp 60 to increase its output voltage, thereby increasing the voltage at the gates of transistors 52 in array 2, as well as at the gates of transistors 72 in bit line differential voltage detection circuit 56. This will increase the pull-down current $i_{PD}'$ of dummy bit lines DBL and DBL—, and also increase the pull-down current $i_{PD}$ for bit lines BL and BL— in the selected column in array 2. It should of course be noted that unselected columns in array 2 will not have a pull-down current at all, since their associated transistors 50 will be turned off by the low state of the associated line YSEL for such columns. The increased $i_{PD}'$, according to equation (1), will result in a reduced dummy bit line differential voltage $dV_{DBL}$, which will cause the voltage of node N— to rise, resulting in further adjustment at the output of op amp 60.

Similarly, in the case where the dummy bit line differential voltage $dV_{DBL}$ is lower than the offset voltage $V_{os}$ (due to similar changes in the operating parameters as in the case of increased dummy bit line differential voltage, but of the opposite direction of change), node N+ will be low relative to node N—. This will cause a decrease in the output voltage of op amp 60, in turn resulting in a reduced gate drive to transistors 52 and 74, and thereby a reduction in the currents $i_{PD}$ and $i_{PD}'$. The reduction in current $i_{PD}$ will cause an increase in the dummy bit line differential voltage.

This positive feedback arrangement will eventually result in a dummy bit line differential voltage $dV_{DBL}$ equal to the offset voltage $V_{os}$ of level shifter circuit 58. Since the offset voltage $V_{os}$ is defined by currents from current sources which are relatively stable over a given temperature and voltage range, the offset voltage $V_{os}$ will be similarly stable, and accordingly the differential bit line voltage $dV_{BL}$ will be adjusted to also be relatively stable over the voltage and temperature ranges. In addition, to the extent that the current sources 80a and 80b are stable over a range of MOS transistor threshold voltages, effective channel lengths and k' values, the offset voltage $V_{os}$ and accordingly the differential bit line voltage $dV_{BL}$ will be held stable by the circuit according to the invention.

In the above embodiments of the invention, the series resistance of the bit lines BL and BL__ are not considered as a factor in determining the differential bit line voltage $dV_{BL}$. However, as the length of the bit lines BL and BL__ increase, especially n high density memories where the width of the metal or other conductors for bit lines BL and BL__ is reduced, the series resistance of the bit lines BL and BL__ may become significant. In the case where the selected memory cell 24 is relatively near the sense amplifier, the bit line resistance in series with the resistors 39a and 39b of FIGS. 3 and 4 may be especially significantly. It should also be noted the p-channel transistors 26 and 30 in memory cells 24 do not actively pull up the bit line BL or BL__ (depending upon the data state), since the voltage of the high bit line is at $V_{cc}-V_{be}$ due to pull-up transistors 38; accordingly, the source-to-drain voltage of the "one" of transistors 26 and 30 is not sufficiently greater than the threshold voltage of the transistor to allow the p-channel transistor 26 or 30 to pull up the bit line. Accordingly, to add the effects of series bit line to the resistance $R_{39}$ of equation (1), the following equation results:

$$dV_{BL} = [i_{cell}1(R_{39}+R_{BL}) - (i_B*(R_{39}+R_{BLtot})] +$$

$$V_{th}ln[(i_{cell}+i_{PD})/(i_B+i_{PD})]$$

where $R_{BL}$ is the resistance of the bit line between the selected memory cell 24 and resistor 39, and where $R_{BLtot}$ is the series resistance of the entire length of the bit line. It should be noted that the value of $R_{BL}$ is limited to the length of the bit line between the selected memory cell 24 and resistor 39, since there is very little current through the portion of the bit line BL or BL__ between the selected memory cell 24 and the base of the associated transistor 42 (thus very little voltage drop thereacross).

As the value of the resistance $R_{BL}$ and $R_{BLtot}$ increase, according to equation (2) the value of the differential bit line voltage $dV_{BL}$ will also increase. As discussed above, it is preferable to minimize this differential bit line voltage in order to provide high performance in the case where a read cycle is performed in the same selected column as the prior cycle and results in the opposite data state, so it is therefore desirable to adjust the $dV_{BL}$ to compensate for the increased resistances. Furthermore, it is desirable to remove variations in the bit line differential voltage which are address dependent, as the value of $R_{BL}$ will vary with the row address of the selected memory cell 24.

Figure 7:
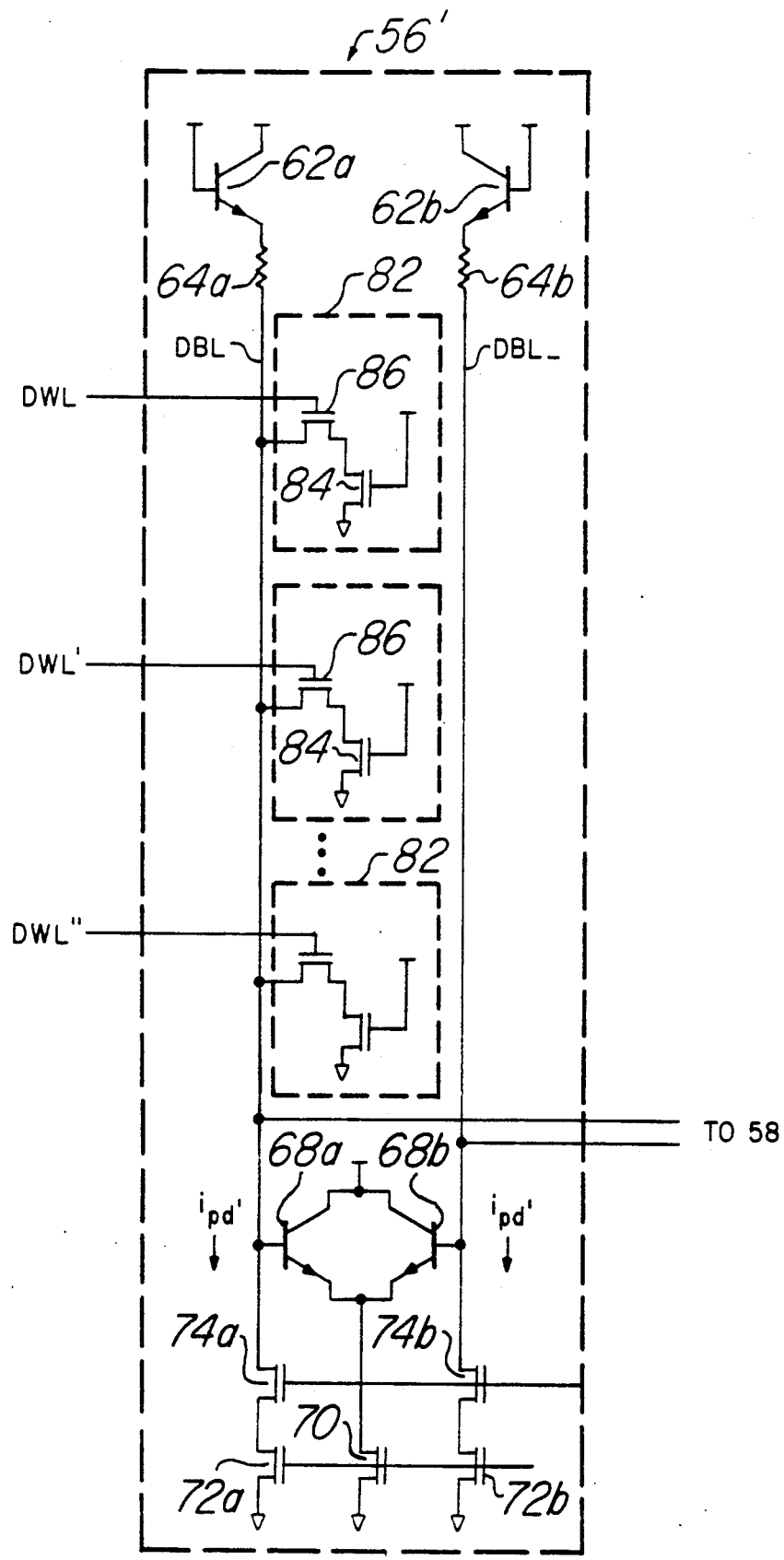
FIGS. 7 and 8 are electrical diagrams, in schematic form, of additional embodiments of the bit line differential voltage detection circuit in the gain control circuit of FIG. 6.

Referring to FIG. 7, another embodiment of the invention is illustrated which is intended to maintain a relatively constant differential bit line voltage $dV_{BL}$ in the event that the resistance $R_{BL}$ increases due to the selection of a memory cell 24 near sense amplifier 10' in the selected column. The circuit of FIG. 7 accomplishes this by adjusting the second term of equation (2) to the extent necessary to compensate for the increase in the first term of equation (2) from the bit line resistance. This is done by adding series resistance into dummy bit lines DBL and DBL__ which corresponds to the series bit line resistance of bit lines BL and BL__ on the high side, and to the portion of the series bit line resistance of bit lines BL and BL__ between the selected memory cell 24 and pull down resistor 39, on the low side. The addition of such series resistance into differential bit line voltage detection circuit 56' of FIG. 7 allows compensation of pull-down current $i_{PD}$ according to the series bit line resistance, as well as adjustment of pull-down current $i_{PD}$ according to the address of the selected row.

The embodiment of FIG. 7 illustrates differential bit line voltage detection circuit 56' containing multiple dummy memory cells 82. Similarly as transistors 66 in the above-described embodiment, cells 82 are for emulating the current $i_{cell}$ drawn by the selected memory cell 24 in array 2. Each of dummy memory cells 82 contains a transfer gate 86 connected between dummy bit line DBL and the drain of an n-channel transistor 84 having its gate biased to $V_{cc}$ and its source at ground. Transfer gate 86 connects transistor 84 to dummy bit line DBL response to a dummy word line signal DWL received at its gate. As noted above, p-channel transistors 26 and 30 in memory cells 24 do not actively pull up the bit line BL or BL__ (depending upon the data state), since the voltage of the high bit line is at $V_{cc}-V_{be}$ due to pull-up transistors 38; accordingly, the source-to-drain voltage of the "on" one of transistors 26 and 30 is not sufficiently greater than the threshold voltage of the transistor to allow the p-channel transistor 26 or 30 to pull up the bit line. Also as noted above, the portion of dummy bit line DBL between the selected dummy cell 82 and bipolar transistor 68a does not add to the effective series resistance of dummy bit line DBL, since very little current passes therethrough. Accordingly, emulation of the series bit line resistance may be accomplished by the connection dummy bit lines DBL and DBL__ to level shifter circuit 58, near the bases of transistors 68. Each of dummy cells 82 thus emulates the characteristics of a selected memory cell 24 in array 2 relative to its connection to bit lines BL and BL__.

The multiple ones of dummy cells 82 are selected by dummy word lines DWL generated by the row decoder 6 (see FIG. 1), according to the row address received on the nine most significant address inputs $A_n$. The multiple ones of dummy cells 82 associated with different dummy word lines DWL thus add variable series bit line resistance to dummy bit line DBL in the same fashion that such variable series bit line resistance is added in array 2.

The remainder of the automatic gain control circuit 54 operates in the same manner as described hereinabove. However, to the extent that the series resistance of dummy bit line DBL varies, the differential dummy bit line voltage $dV_{DBL}$ will also vary according to equation (2). An increase in the series resistance of the dummy bit line DBL would result in a larger differential dummy bit line voltage, which would, via the level shifter circuit 58 described above, present an input to op amp 60 to increase the current $i_{PD}$ through transistors 72 and 52, dropping the differential dummy bit line voltage as well as reducing the differential bit line voltage $dV_{BL}$ in the selected column of array 2. To the extent that the series dummy bit line resistance matches the series bit line resistance in the selected column of array 2, the circuit of FIG. 7 can thus cause an accurate adjustment in the pull-down current $i_{PD}$, accordingly stabilizing the differential bit line voltage $dV_{BL}$ over the range of row addresses, and accordingly series bit line resistances, in the memory.

Various techniques for arranging dummy cells 82 can be used, depending upon the space and accuracy constraints of the memory layout. For example, the most accurate emulation of the series bit line resistance in bit line differential voltage detection circuit 56' would be to have a dummy cell 82 corresponding to each of the rows in array 2; in the 1 Mbit SRAM described hereinabove having 512 rows, 512 dummy cells 82 would be provided within bit line differential voltage detection circuit 56', with 512 dummy word lines DWL associated in a one-to-one correspondence with the 512 word lines in array 2. A more space efficient technique could alternatively used, with fewer dummy cells 82. If, for example, four dummy cells 82 were provided within bit line differential voltage detection circuit 56', only four dummy word lines DWL would be necessary; row decoder 6 could drive these four dummy word lines DWL in correspondence with the row selected in array 2 by decoding the two most significant row address bits. Such a configuration with fewer dummy cells 82 could provide improved accuracy to a certain degree, with a minimum of necessary circuit area required. Of course, any number of dummy cells 82 ranging from two to the number of actual rows in array 2 may be used; it is of course preferable that the number of dummy cells 82 be a power of 2 so that the decoding of the row address to drive dummy word lines DWL be kept relatively simple.

Figure 8:
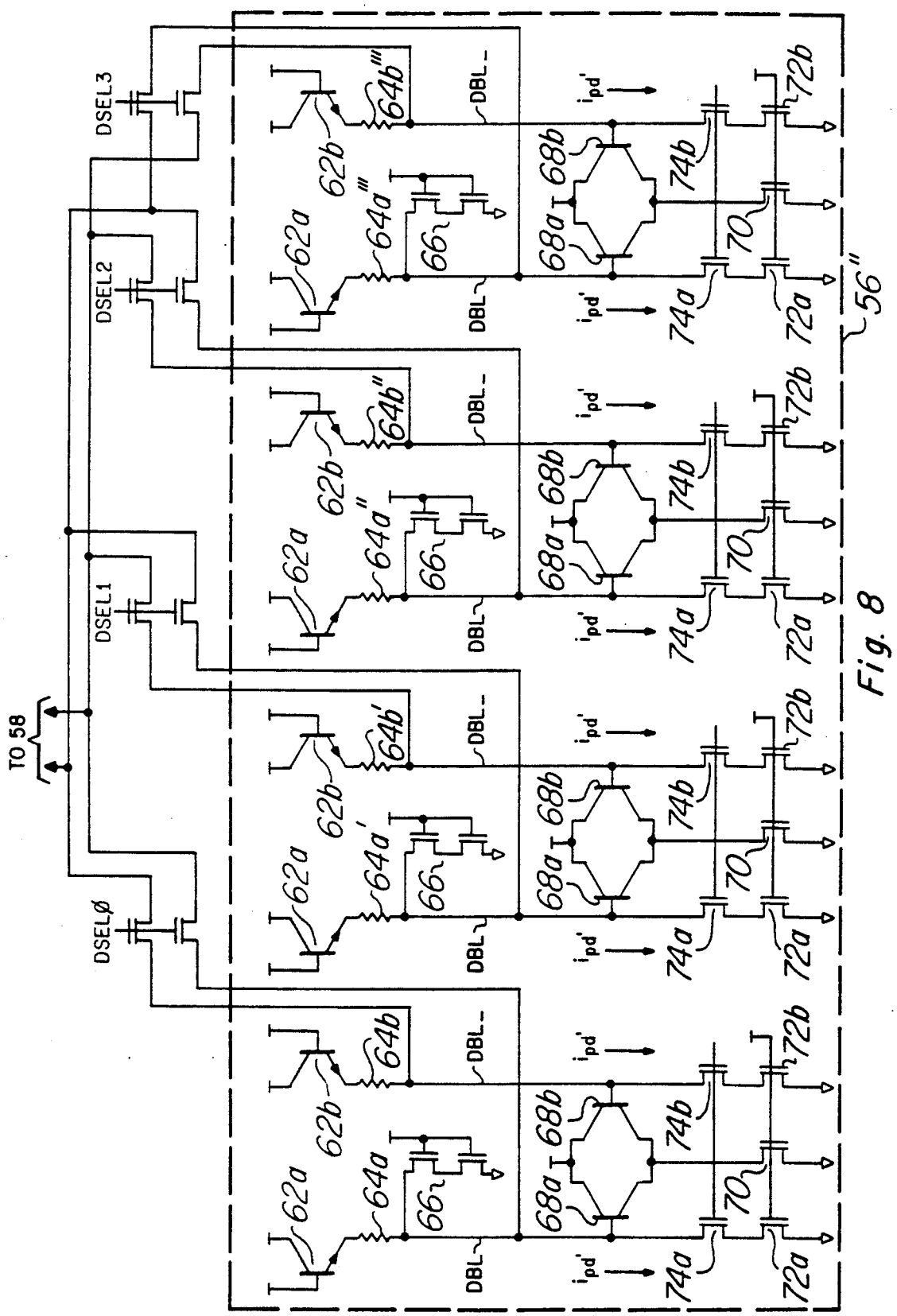

FIG. 8 illustrates another alternative embodiment of the invention for addressing the effects of increased series bit line resistance due to selection of memory cells 24 near sense amplifier 10' in array 2. In FIG. 8, differential bit line voltage detection circuit 56" has multiple dummy columns, each with transistors 66 for emulating the current $i_{cell}$ of the selected memory cell 24. However, the multiple dummy columns each having varying pull-up resistances between the pull-up transistors 62a and the dummy bit line DBL therewithin. For the greatest degree of accuracy, for each dummy column the varying resistance in series with dummy bit line DBL would be the value of the pull-up resistor 39 plus a resistance value approximately equal to the average series bit line resistance for the memory cells having a row address in the range corresponding to the dummy column. For example, the four dummy columns of FIG. 8 may correspond to first through fourth quarters of array 2 taken by row address. Accordingly, for the four dummy columns shown in FIG. 8, resistors 64a and 64b may have a resistance equal to the sum of resistor 38a in array 2 and one-eighth of the series bit line resistance of one of bit lines BL and BL__, resistors 64a' and 64b' may have a resistance equal to the sum of resistor 39a plus three-eighths of the series bit line resistance of one of bit lines BL and BL__, resistors 64a" and 64b" may have a resistance equal to the sum of resistor 39a plus five-eighths of the series bit line resistance of one of bit lines BL and BL__, and resistors 64a''' and 64b''' may have a resistance equal to the sum of resistor 39a and seven-eighths of the series bit line resistance of one of bit lines BL and BL__.

One of the dummy columns is selected according to the decoded row address from row decoder 16, to correspond to the location in the array of the selected memory cell 24 in array 2. This can be done, in the case of four dummy columns, by decoding the two most significant bits of the row address to drive four dummy column select lines DSEL0 through DSEL3. These dummy column select lines can then connect the selected one of the dummy bit line pair DBL and DBL__ to the input of the level shifter circuit 58. The unselected ones of the dummy columns may receive the output of op amp 60, but the change in $i_{PD}$ in such columns of course will not be fed back to level shifter circuit 58. If desired, the dummy column select lines may also be used to control the gates of transistors 74, so that the unselected ones of the dummy columns will not draw DC current when not selected.

It is of course noted that any number of dummy columns may of course be used in the embodiment of FIG. 8. It is of course preferably from a decoding standpoint to have a power of 2 as the number of dummy columns.

Figure 9:
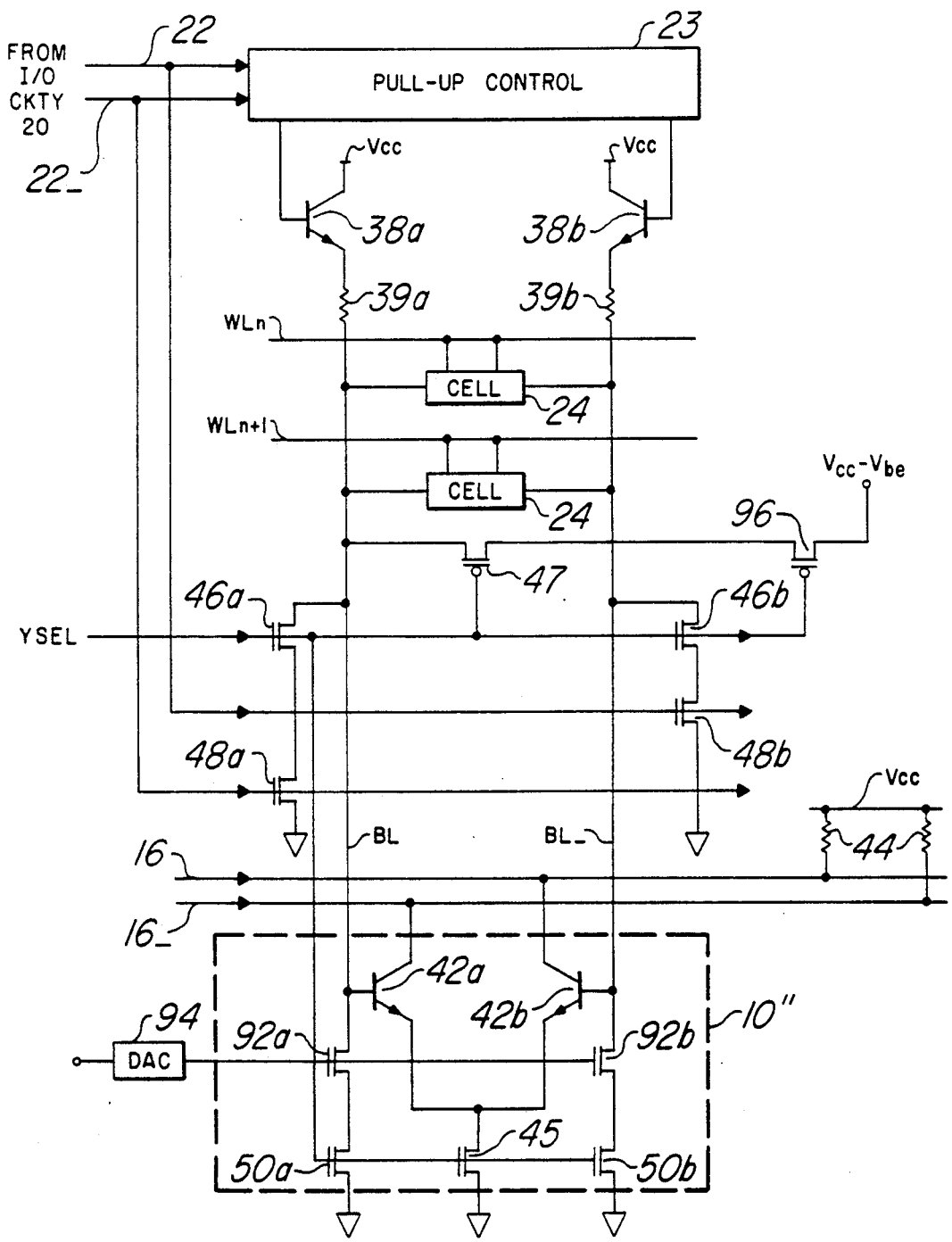
FIG. 9 is an electrical diagram, in schematic form, of an additional embodiment of the bit line pair of FIG. 3.

Referring now to FIG. 9, another embodiment of the invention is illustrated which adjusts the current $i_{PD}$ according to the series bit line resistance is illustrated. In this embodiment, the automatic gain control circuit 54 is not shown as included in the column, although the automatic gain control circuit 54 described above relative to FIGS. 5 and 6 can be included in combination with the embodiment of FIG. 9. FIG. 9 illustrates a column in array 2 which provides n-channel transistors 92a and 92b in series with pull-down transistors 50a and 50b, respectively. The gates of transistors 92a and 92b are driven by a digital-to-analog converter 94 which receives the row address from address inputs $A_n$, preferably via an address buffer (not shown), and which presents a voltage at its output corresponding to the received row address value. The gates of transistors 92a and 92b can thus be controlled to provide increased $i_{PD}$ in the event that the selected row is near sense amplifier 10" (i.e., in the case of an increased series bit line resistance which causes an increased bit line differential voltage $dV_{BL}$ according to equation (2)), and to provide reduced $i_{PD}$ in the event that the selected row is away from sense amplifier 10" (in the case of a decreased series bit line resistance which causes a decreased bit line differential voltage according to equation (2)). Accordingly, the pull-down current can be adjusted directly based on the selected row address.

FIG. 9 illustrates a further improvement to the bit line scheme of the memory. The improvement of FIG. 9 is especially useful if array 2 is organized into blocks, where a word line is selected only for the block containing the selected (by column address) cell, and where no word line is selected in the other blocks. Such block organization is particularly preferable for purposes of reducing power dissipation. An example of such block organization for a 1 Mbit SRAM organized as 512 rows by 2048 columns would be the division of the 2048 columns into sixteen blocks of 128 columns each. In operation, each of the unselected columns in the block having the selected word line will have a memory cell 24 connected to the bit lines BL and BL__, so that one of bit lines BL and BL__ will be pulled down by the corresponding n-channel transistors 28 or 32 in the memory cell 24 in the selected row to a voltage near $V_{cc} - V_{be}$. The equalization provided by transistor 47 between bit lines BL and BL__ in an unselected column will then keep both bit lines BL and BL__ from floating to an undesirably high voltage.

In the circuit as shown in FIG. 3, if the memory were arranged into such blocks, no memory cells 24 are connected to bit lines BL and BL__ for those blocks which have no word line activated. Since bit lines BL and BL__ are not pulled down in these columns, noise coupling to bit lines BL and BL__ can raise the potential thereof to an undesirably high level, slowing the performance in a memory cycle selecting a cell in the previously unselected block, as bit lines BL and BL__ must first be discharged before valid data can be sensed. It should be noted that the time during which a block of array 2 may remain unselected may be quite large, for example in the case of repeated accesses of data stored in locations having sequential addresses, so that a large number of accesses are performed in one block of array 2.

The improvement illustrated in FIG. 9 provides p-channel transistor 96 connected between bit line BL__ and a reference voltage $V_{cc}-V_{be}$. The voltage of $V_{cc}-V_{be}$ is preferable, as it is the voltage to which the unselected bit lines in the block containing the selected memory cell 24 is biased. The gate of transistor 96 is controlled by the column select line YSEL. In the case of the column not being selected, line YSEL is low, which turns on transistor 47 to equalize the bit lines and, according to this embodiment of the invention, turns on transistor 96 to connect the voltage $V_{cc}-V_{be}$ to the bit lines. Accordingly, transistor 96 provides the additional advantage of keeping the bit lines BL and BL__ from floating during non-selected cycles, thereby reducing time needed in successive cycles for the bit lines BL and BL__ to recover from noise coupled thereto.

The provision of the additional transistor 96 as described above relative to FIG. 9, for all columns in array 2, ensures that the potential of the bit lines BL lines are at a desirable potential, regardless of the block organization of array 2. It should be further noted that the line which provides $V_{cc}-V_{be}$ may come from the bit lines in the selected block, without requiring an external (to array 2) and complicated reference tracking circuit. The resulting bias will be correct across array 2, regardless of operating and process variations. If it is desirable to establish a voltage for unselected bit lines other than $V_{cc}-V_{be}$, such other voltage may thus be communicated to all bit lines by connection of the bit lines among all blocks as described above.

Although the invention has been described in detail herein with reference to its preferred embodiments, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A sense amplifier for connection to a bit line pair, comprising:
   first and second bipolar transistors having their bases connected to first and second bit lines in said bit line pair, and having their emitters coupled together;
   a sense current source connected between said emitters of said bipolar transistors and a first reference voltage, said sense current source comprising a field effect transistor; and
   first and second pull-down current sources connected between the bases said first and second bipolar transistors, respectively, and a second reference voltage, said first and second pull-down current sources each comprising a field effect transistor, said first and second field effect transistors including a common gate connection with said field effect transistor of said sense current source.

2. The sense amplifier of claim 1, wherein the source-to-drain paths of said first and second field effect transistors are connected between said base of said first and second bipolar transistors, respectively, and said second reference voltage, and the gates of said first and second field effect transistors are controlled by a column select signal.

3. The sense amplifier of claim 2, wherein said sense current source comprises a field effect transistor having its source-to-drain path connected between the emitters of said first and second bipolar transistors and said first reference voltage, and having its gate controlled by a column select signal.

4. The sense amplifier of claim 1, wherein said first and second reference voltages are the same voltage.

5. The sense amplifier of claim 1, further comprising means for controlling the current sourced by said first and second pull-down current sources.

6. The sense amplifier of claim 5, wherein said means for controlling comprises:
   means for presenting a signal to said first and second pull-down current sources.

7. The sense amplifier of claim 6, wherein said first and second pull-down current sources comprise first and second field effect transistors having their source-to-drain paths connected between the bases of said first and second bipolar transistors, respectively, and said second reference voltage;
   and wherein said presenting means comprises a digital-to-analog converter having an output connected to the gates of said first and second field effect transistors.

8. The sense amplifier of claim 6, wherein said means for controlling comprises:
   a bit line differential voltage detection circuit having an output; and
   an amplifier, receiving the output of said bit line differential voltage detection circuit, for applying a control voltage to said first and second pull-down current sources responsive to the output of said bit line differential voltage detection circuit.

9. The sense amplifier of claim 5, further comprising:
   first and second select transistors, connected in series with said first and second pull-down current sources, respectively, between said bases of said first and second bipolar transistors and said second reference voltage, said first and second select transistors controlled by a select signal so that the bases of said first and second bipolar transistors are not coupled to said second reference voltage responsive to said select signal indicating said sense amplifier being not selected.

* * * * *